(12) United States Patent
Saita et al.

(10) Patent No.: US 9,082,917 B2
(45) Date of Patent: Jul. 14, 2015

(54) SOLAR CELL MODULE

(75) Inventors: Atsushi Saita, Kobe (JP); Hiroshi Kanno, Kobe (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 500 days.

(21) Appl. No.: 12/867,784

(22) PCT Filed: Feb. 18, 2009

(86) PCT No.: PCT/JP2009/052739
§ 371 (c)(1),
(2), (4) Date: Sep. 17, 2010

(87) PCT Pub. No.: WO2009/104627
PCT Pub. Date: Aug. 27, 2009

(65) Prior Publication Data
US 2011/0017261 A1    Jan. 27, 2011

(30) Foreign Application Priority Data
Feb. 21, 2008  (JP) ................. 2008-040589

(51) Int. Cl.
*H01L 31/0224* (2006.01)
*H01L 31/05* (2014.01)

(52) U.S. Cl.
CPC .... *H01L 31/0512* (2013.01); *H01L 31/022433* (2013.01); *H01L 31/0508* (2013.01); *Y02E 10/50* (2013.01)

(58) Field of Classification Search
CPC . Y02E 10/50; H01L 31/05; H01L 31/022425; H01L 31/042; H01L 31/022433; H01L 31/0508; H01L 31/0512; H01L 2224/83192; H01L 2224/83851; H01L 2224/83855; H01L 24/29; H01L 25/042; H01L 27/142
USPC ................................. 136/243–265
See application file for complete search history.

(56) References Cited

U.S. PATENT DOCUMENTS

| | | | |
|---|---|---|---|
| 2005/0115602 A1* | 6/2005 | Senta et al. | 136/250 |
| 2007/0095387 A1* | 5/2007 | Fujii et al. | 136/251 |
| 2007/0235077 A1* | 10/2007 | Nagata et al. | 136/256 |
| 2009/0235972 A1* | 9/2009 | Fukushima et al. | 136/244 |
| 2010/0108141 A1* | 5/2010 | Fukushima et al. | 136/256 |
| 2013/0071755 A1* | 3/2013 | Oguro | 429/245 |

FOREIGN PATENT DOCUMENTS

| | | | |
|---|---|---|---|
| EP | 187633 A1 | * | 7/1986 |
| JP | 07147424 A | * | 6/1995 |
| JP | 2001044459 A | * | 2/2001 |

(Continued)

OTHER PUBLICATIONS

Machine translation of JP 07-147424 to Saito.*

(Continued)

*Primary Examiner* — Jeffrey T Barton
*Assistant Examiner* — Eric R Smith
(74) *Attorney, Agent, or Firm* — Marvin A. Motsenbocker; Mots Law, PLLC (57) ABSTRACT

In a solar cell module 100, the wiring member 11 is connected onto the connection electrode 40 through a resin adhesive 12; and the connection electrode 40 includes a plurality of projections 40a which are in direct contact with the wiring member.

16 Claims, 9 Drawing Sheets

(56) References Cited

FOREIGN PATENT DOCUMENTS

| JP | 2001343903 A | * | 12/2001 |
| WO | WO 2007125903 A1 | * | 11/2007 |
| WO | WO 2008139995 A1 | * | 11/2008 |

OTHER PUBLICATIONS

"Hardness Testing Copper Alloy Products," published by Materion (2011) [retrieved from internet at http://materion.com/~/media/Files/PDFs/Alloy/Tech%20Briefs/AT0012-0311%20-%20Tech%20Briefs%20-%20Hardness%20Testing%20Copper%20Alloy%20Products.pdf on Apr. 16, 2013].*

Y. Miyazawa and T. Ariga, "Microstructural change and hardness of lead free solder alloys," EcoDesign '99: First International Symposium on Environmentally Conscious Design and Inverse Manufacturing Proceedings, p. 616-619, Feb. 3, 1999.*

Machine translation of JP2001343903A.*

Machine translation of JP2001-044459A.*

* cited by examiner

SOLAR CELL MODULE

TECHNICAL FIELD

The present invention relates to a solar cell module including a plurality of solar cells connected to each other through a wiring member.

BACKGROUND ART

A solar cell is expected as a new energy source because the solar cell directly converts clean and inexhaustibly supplied sunlight into electricity.

In general, energy output per solar cell is approximately several watts. Accordingly, when solar cells are used as a power source for a house, a building or the like, a solar cell module is used in which a plurality of solar cells are connected to each other to enhance energy output.

The plurality of solar cells are electrically connected to each other through a wiring member and sealed with a sealant. The wiring member is connected onto a connection electrode formed on the main surface of each solar cell.

Here, a method is proposed in which a resin adhesive is inserted between the wiring member and the connection electrode to bond the wiring member to the connection electrode, the resin adhesive being thermally cured at a temperature lower than the melting temperature of a solder (see JP-A 2007-214533, for example). An electrical connection between the wiring member and the connection electrode is established through a plurality of conductive particles included in the resin adhesive. With the method, the influence of temperature change on a solar cell can be reduced as compared to the case where the wiring member is soldered to the connection electrode.

However, most of the conductive particles are located dispersed from each other. Hence, there is a problem in which it is difficult to maintain a favorable electrical connection between the connection electrode and the wiring member due to the displacement of the conductive particles existing between the connection electrode and the wiring member.

To be more specific, since the sealant has a linear expansion coefficient larger than that of the wiring member, the wiring member receives stress from the sealant due to temperature change under environment where the solar cell module is used. Such stress is transmitted to the resin adhesive and thereby deforms the resin adhesive. This displaces the positions of the conductive particles in the resin adhesive, and consequently causes a problem in which an electrical connection cannot be established in some portions.

Such a problem is likely to occur when projections are formed on a wiring-member-side surface of the connection electrode and when the conductive particles sandwiched between the projections and the wiring member are moved from between the projections and the wiring member.

The present invention has been made in view of the above problem. An object thereof is to provide a solar cell module capable of maintaining a favorable electrical connection between a wiring member and a connection electrode.

DISCLOSURE OF THE INVENTION

An aspect of the present invention is summarized as a solar cell module comprising: a plurality of solar cells; a wiring member configured to electrically connect the plurality of solar cells to each other; and a sealant with which the plurality of solar cells are sealed, wherein one solar cell included in the plurality of solar cells includes a photoelectric conversion body configured to generate a light generation carrier by receiving light, and a connection electrode formed on the photoelectric conversion body and connected to the wiring member; the wiring member is connected onto the connection electrode through a resin adhesive; and the connection electrode includes a plurality of projections which are in direct contact with the wiring member.

Since the connection electrode has the plurality of projections which are in direct contact with the wiring member in this way, it is possible to establish a favorable electrical connection between the connection electrode and the wiring member. Thus, even when the wiring member receives stress from the sealant in accordance with temperature change under environment where the solar cell module is used, it is possible to establish a favorable electrical connection between the connection electrode and the wiring member.

Moreover, the above plurality of projections may be in direct contact with the wiring member in such a way as to bite into the wiring member. Since the plurality of projections bite into the wiring member in this way, a contact area between the connection electrode and the wiring member 11 is increased. This makes an electrical connection between the connection electrode and the wiring member more favorable, and increases their mechanical connection strength.

In the solar cell module according to the aspect of the present invention, the plurality of projections each may bite into the wiring member.

In the solar cell module according to the aspect of the present invention, the wiring member may include a low resistive element and an electrical conductor which covers an outer periphery of the low resistive element, and the plurality of projections may bite into the electrical conductor.

In the solar cell module according to the aspect of the present invention, in a direction substantially orthogonal to an arrangement direction in which the plurality of solar cells are arranged, a ratio of a sum of widths of the respective plurality of projections at portions biting into the wiring member with respect to a width of the wiring member may be not lower than 0.05.

In the solar cell module according to the aspect of the present invention, the plurality of projections may include a plurality of first projections and a plurality of second projections taller than the plurality of first projections; and parts of the respective plurality of first projections may be in direct contact with the wiring member.

In the solar cell module according to the aspect of the present invention, the plurality of first projections may be arranged in a direction crossing the arrangement direction in which the plurality of solar cells are arranged.

In the solar cell module according to the aspect of the present invention,

In the solar cell module according to the aspect of the present invention, the resin adhesive includes a plurality of conductive particles.

In the solar cell module according to the aspect of the present invention, the plurality of conductive particles are dispersed in the resin adhesive.

BEST MODES FOR CARRYING OUT THE INVENTION

Next, an embodiment of the invention is described with reference to the drawings. In the following description of the drawings, identical or similar reference numerals are given to identical or similar components. However, the drawings are only schematic, thus it should be noted that the ratios of dimensions are not shown to scale. Accordingly, specific dimensions should be recognized in consideration of the following description. Also, there are inevitably included some portions of the drawings between which a dimensional relationship and/or a scale are inconsistent.

(Structure of Solar Cell Module)

Figure 1:
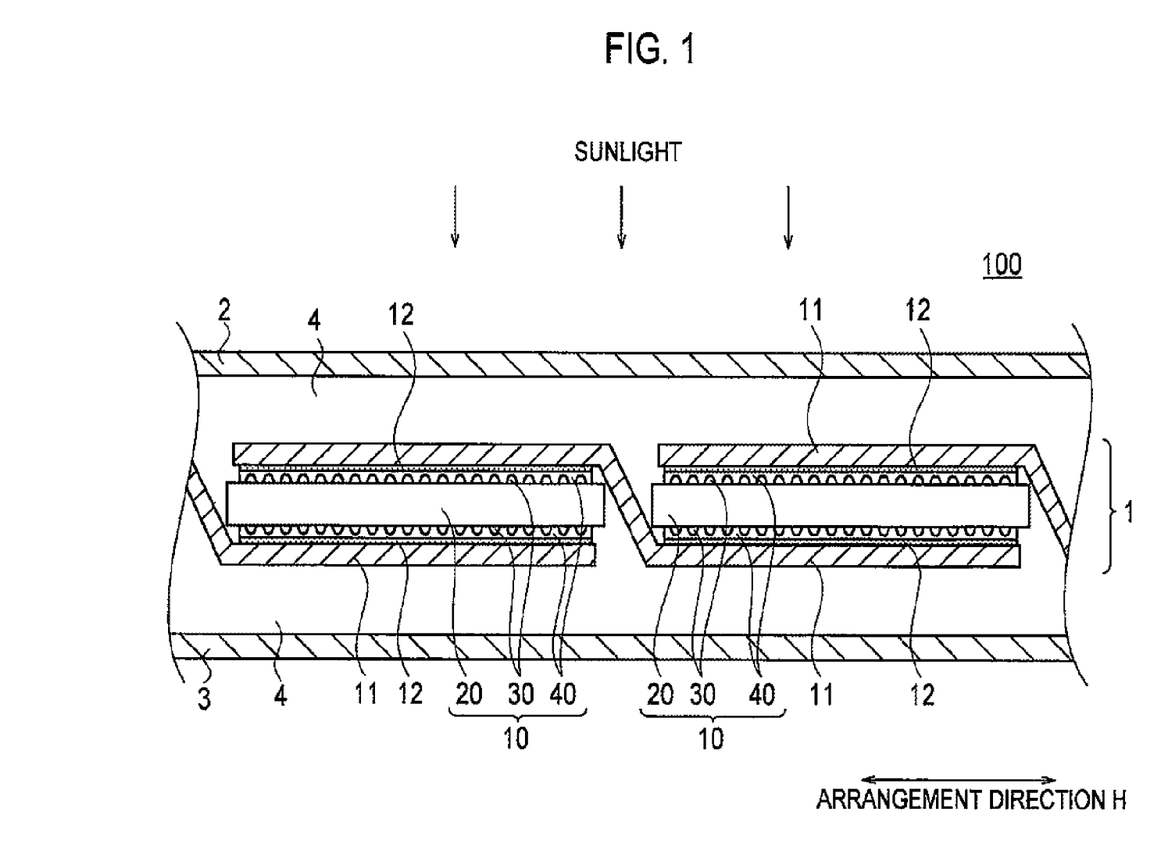
FIG. 1 is a side view of a solar cell module 100 according to an embodiment of the present invention.
Figure 2:
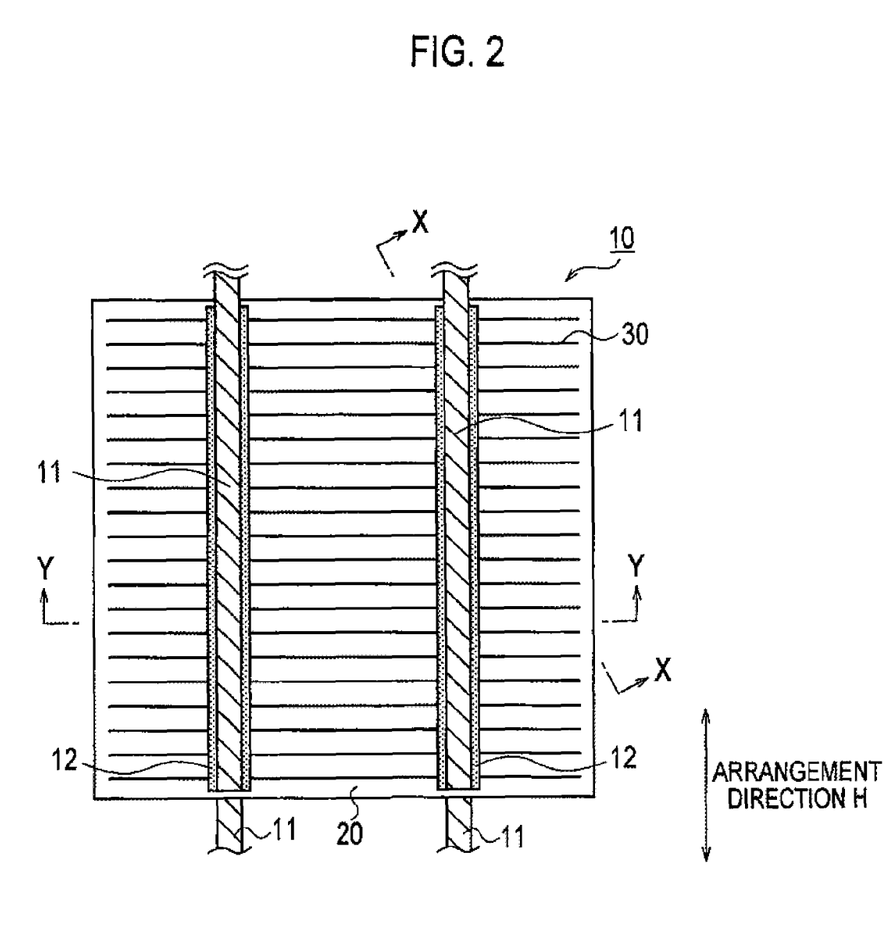
FIG. 2 is an enlarged plan view of a solar cell string 1 according to the embodiment of the present invention.

A schematic structure of a solar cell module 100 according to an embodiment of the present invention is described with reference to FIGS. 1 and 2. FIG. 1 is a side view of the solar cell module 100 and FIG. 2 is an enlarged plan view of a solar cell string 1 according to this embodiment.

The solar cell module 100 includes the solar cell string 1, a light-receiving-surface-side protection member 2, a back-surface-side protection member 3, and a sealant 4. The solar cell module 100 is configured in a way to seal the solar cell string 1 with the sealant 4 between the light-receiving-surface-side protection member 2 and the back-surface-side protection member 3.

The solar cell string 1 includes a plurality of solar cells 10, a wiring member 11, and a resin adhesive 12. The solar cell string 1 is configured in a way to connect the plurality of solar cells 10 to each other through the wiring member 11.

The plurality of solar cells 10 are arranged in an arrangement direction H. Each solar cell 10 includes a photoelectric conversion body 20, fine-line electrodes 30, and connection electrodes 40. The detailed structure of the solar cell 10 will be described later.

The wiring member 11 electrically connects the plurality of solar cells 10 to each other. To be more specific, the wiring member 11 is connected to connection electrodes 40 of one solar cell 10 and to connection electrodes 40 of a different solar cell 10 adjacent to the one solar cell 10. The wiring member 11 is connected to such connection electrodes 40 with the resin adhesive 12.

Here, the wiring member 11 is constituted of a low resistive element and an electrical conductor which covers the outer periphery of the low resistive element. As the low resistive element, copper, silver, gold, tin, nickel, or aluminum, or an alloy of these elements in the form of a thin plate or twisted wire may be used. As the electrical conductor, a material of hardness lower than that of the low resistive element may be used. Moreover, the electrical conductor is of such hardness that later-described projections of the connection electrodes 40 may bite thereinto. As the electrical conductor, lead-free solder cover or tin cover may be used.

The resin adhesive 12 is inserted between the wiring member 11 and each connection electrode 40. The resin adhesive 12 is preferably cured at a temperature equal to or lower than the melting point of eutectic solder, i.e., equal to or lower than approximately 200° C. As the resin adhesive 12, not only an adhesive made of an acrylic resin or of a thermosetting resin made of highly flexible polyurethane or the like, but also a two-liquid reaction adhesive obtained by mixing a curing agent with an epoxy resin, an acrylic resin, or a urethane resin may be used, for example. The width of the resin adhesive 12 may be substantially equal to or smaller than that of the wiring member 11.

Moreover, the resin adhesive 12 may be conductive and may be insulative. If conductive, the resin adhesive 12 may include a plurality of conductive particles. As the conductive particles, nickel or nickel coated with gold may be used. Such conductive particles are preferably added to the resin adhesive 12 at 2 to 20 (vol. %) in order to ensure the function of the resin adhesive 12 as an adhesive. Meanwhile, if insulative, the resin adhesive 12 may include a plurality of insulative particles. As the insulative particles, conventionally known particles such as Al2O3 particles may be used.

The light-receiving-surface-side protection member 2 is arranged at a light-receiving surface side of the sealant 4, and protects the front surface of the solar cell module 100. As the light-receiving-surface-side protection member 2, translucent and water-shielding glass, translucent plastic, or the like may be used.

The back-surface-side protection member 3 is arranged at a back surface side of the sealant 4, and protects the back surface of the solar cell module 100. As the back-surface-side protection member 3, a resin film such as a PET (Polyethylene Terephthalate) film, a laminated film with a structure in which Al foil is sandwiched between resin films, or the like may be used.

The sealant 4 seals the solar cell string 1 between the light-receiving-surface-side protection member 2 and the back-surface-side protection member 3. As the sealant 4, a resin which is translucent and made of EVA, EEA, PVB, silicon, urethane, acrylic, epoxy, or the like may be used.

Note that, an Al frame (not shown) may be installed at the outer periphery of the solar cell module 100 having the structure described above.

(Structure of Solar Cell)

Figure 3:
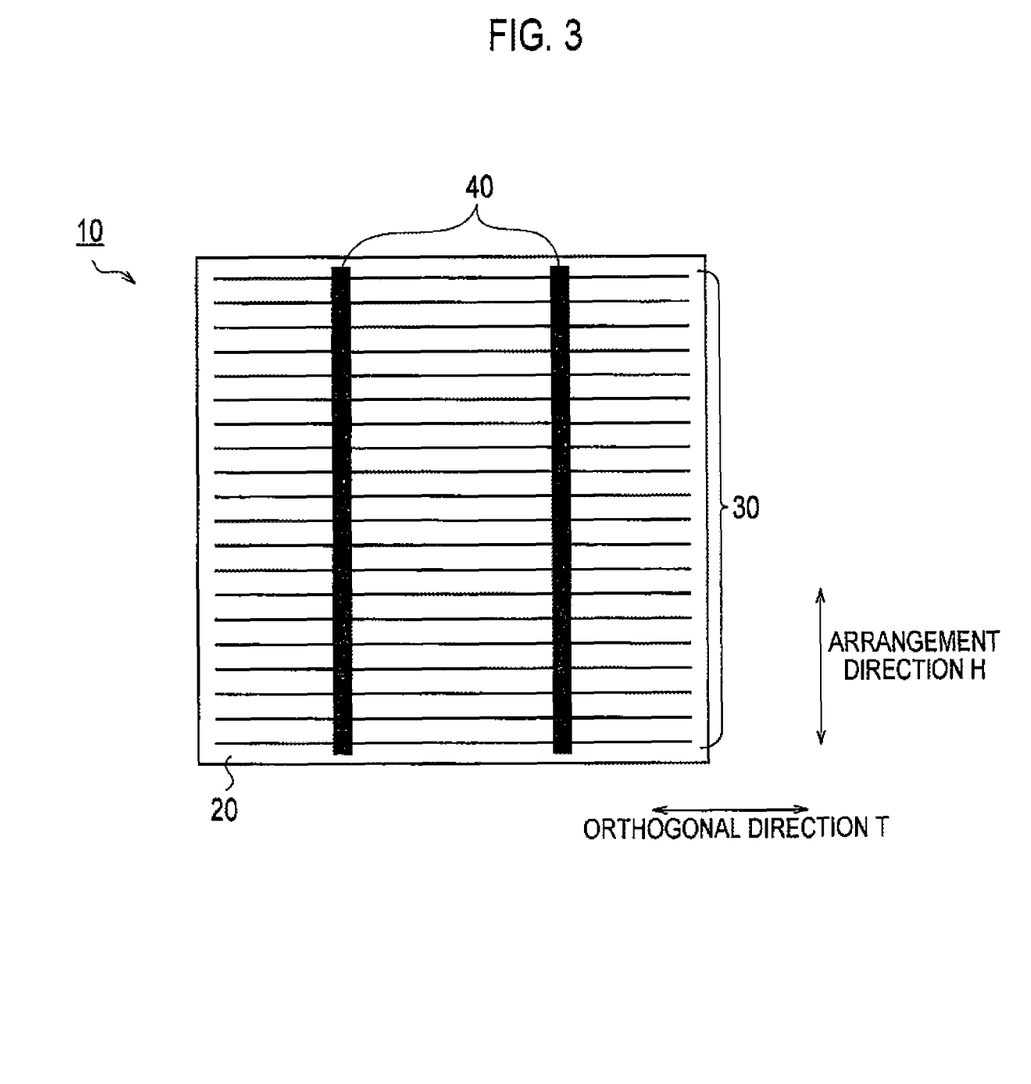
FIG. 3 is a plan view of a solar cell 10 according to the embodiment of the present invention.

Next, a structure of the solar cell 10 is described with reference to FIG. 3. FIG. 3 is a plan view of the solar cell 10.

As shown in FIG. 3, the solar cell 10 includes the photoelectric conversion body 20, the fine-line electrodes 30 and the connection electrodes 40.

The photoelectric conversion body 20 includes a light-receiving surface and a back surface formed opposite the light-receiving surface. The photoelectric conversion body 20 generates light generation carriers by receiving light on the light-receiving surface. A light generation carrier denotes a hole and electron generated when the photoelectric conversion body 20 absorbs sunlight. The photoelectric conversion body 20 includes therein a semiconductor junction such as a pn junction or a pin junction. The photoelectric conversion body 20 may be made of a common semiconductor material including a crystalline semiconductor material such as monocrystalline Si or polycrystalline Si, or a compound semiconductor material such as GaAs or InP. Note that, the photoelectric conversion body 20 may have a so-called HIT structure in which a substantially intrinsic amorphous silicon layer is sandwiched between a monocrystalline silicon substrate and an amorphous silicon layer.

The fine-line electrodes 30 are collection electrodes for collecting carriers from the photoelectric conversion body 20. The fine-line electrodes 30 are formed in plural numbers on the photoelectric conversion body 20 in an orthogonal direction T substantially orthogonal to the arrangement direction H. The fine-line electrodes 30 can be formed by, for example, applying a resin conductive paste, a sintered conductive paste (ceramic paste), or the like by use of a coating method or a printing method.

Note that, as shown in FIG. 1, the fine-line electrodes 30 are formed in the same manner on the light-receiving surface and on the back surface of the photoelectric conversion body 20. The dimensions and the number of the fine-line electrodes 30 may be set appropriately in consideration of the size and the physical properties of the photoelectric conversion body 20, and the like. For example, when the dimension of the photoelectric conversion body 20 is approximately 100 mm square, approximately 50 fine-line electrodes 30 can be formed thereon.

The connection electrodes 40 are electrodes for the connection of the wiring member 11. The connection electrodes 40 are formed on the photoelectric conversion body 20 in the arrangement direction H. Accordingly, the connection electrodes 40 cross the plurality of fine-line electrodes 30. The connection electrodes 40 can be formed by applying a resin conductive paste, a sintered conductive paste (ceramic paste), or the like by use of the coating method or the printing method, as similar to the fine-line electrodes 30.

Note that, as shown in FIG. 1, the connection electrodes 40 are formed in the same manner on the light-receiving surface and on the back surface of the photoelectric conversion body 20. The dimensions and the number of the connection electrodes 40 may be set appropriately in consideration of the size and the physical properties of the photoelectric conversion body 20, and the like. For example, when the dimension of the photoelectric conversion body 20 is approximately 100 mm square, 2 connection electrodes 40 of approximately 1.5 mm width can be formed thereon.

(Projections of Connection Electrode)

Figure 4:
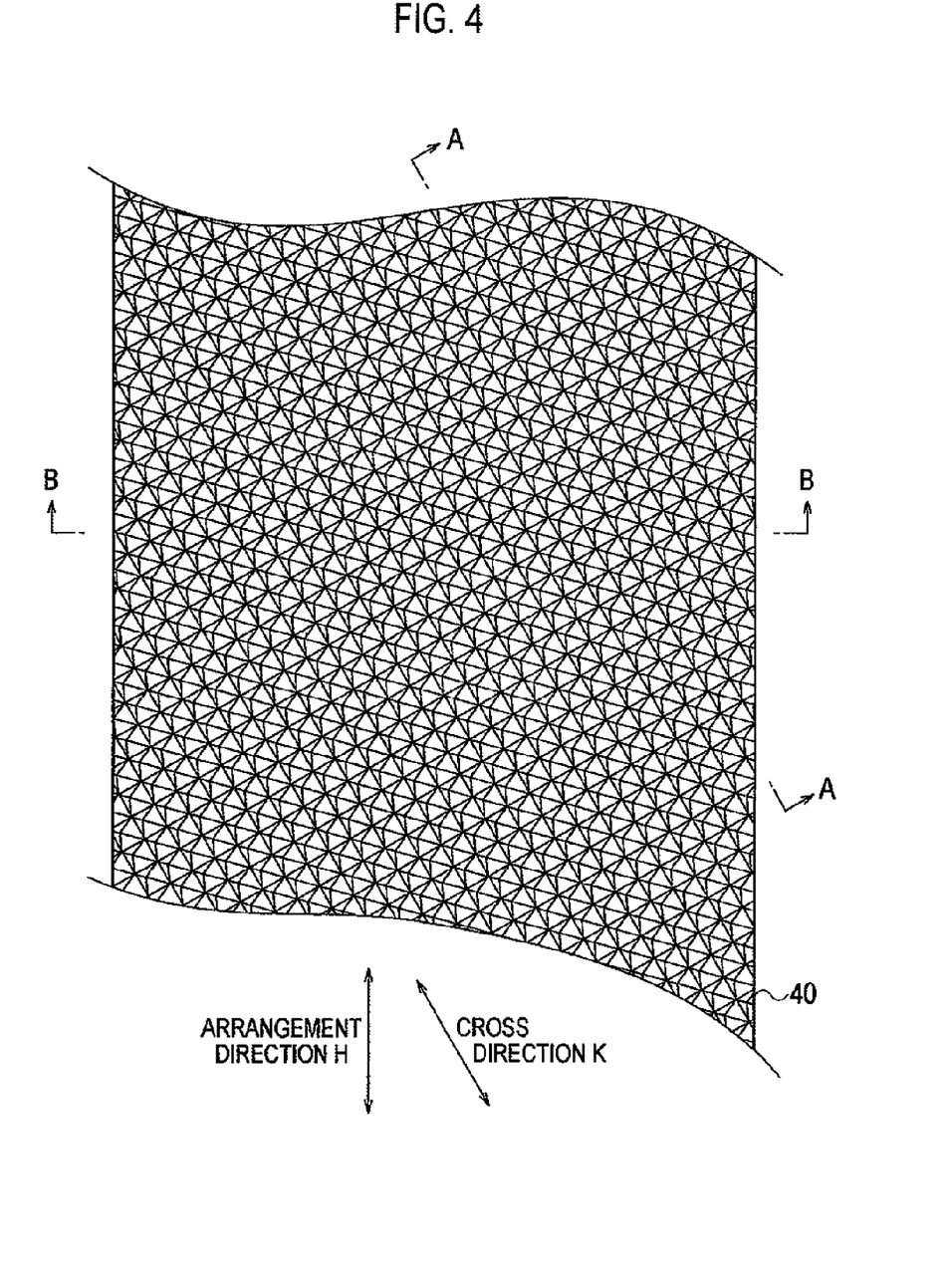
FIG. 4 is an enlarged plan view of a connection electrode 40 according to the embodiment of the present invention.
Figure 5:
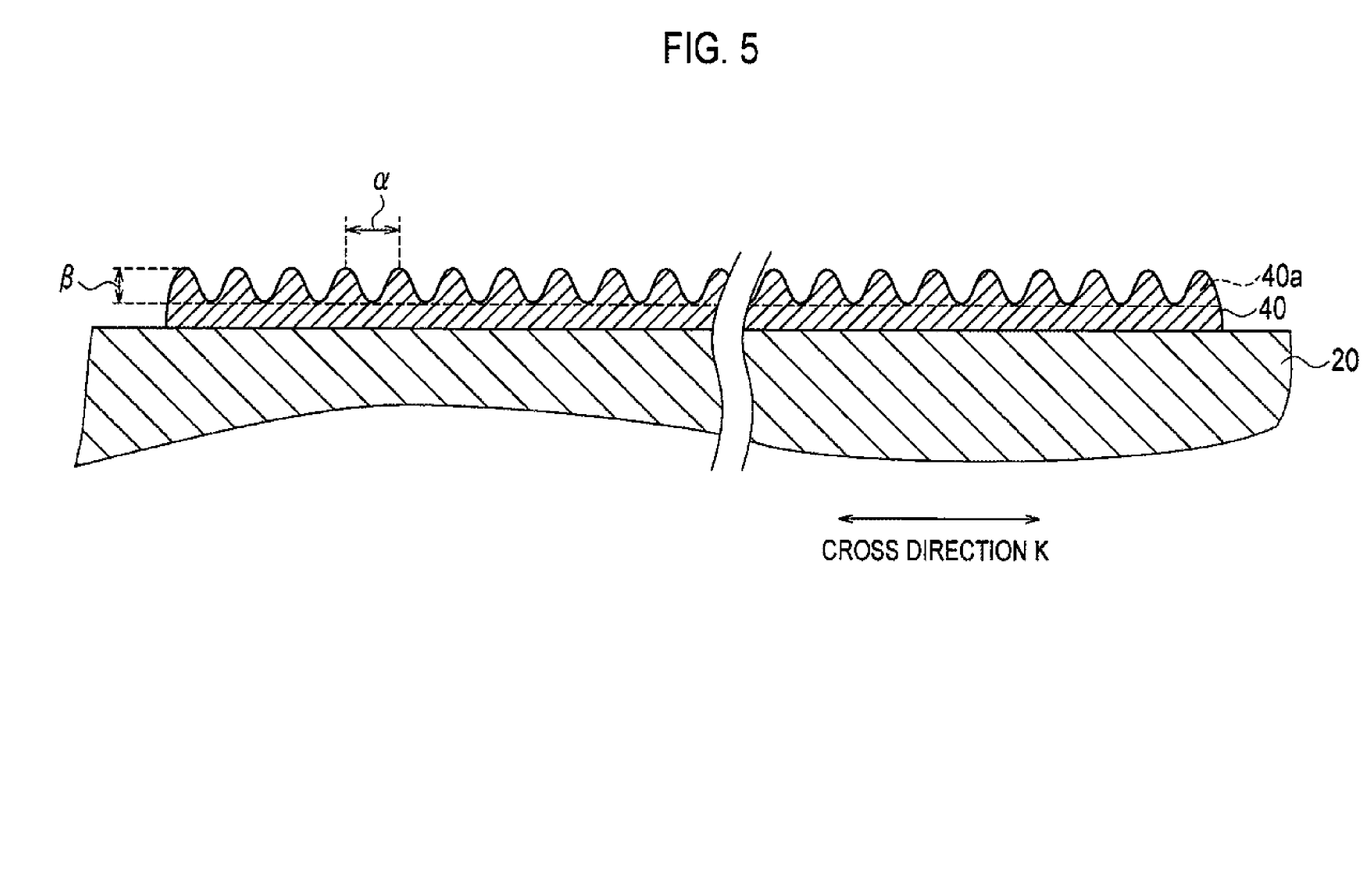
FIG. 5 is a cross-sectional view taken along the line A-A of FIG. 4.
Figure 6:
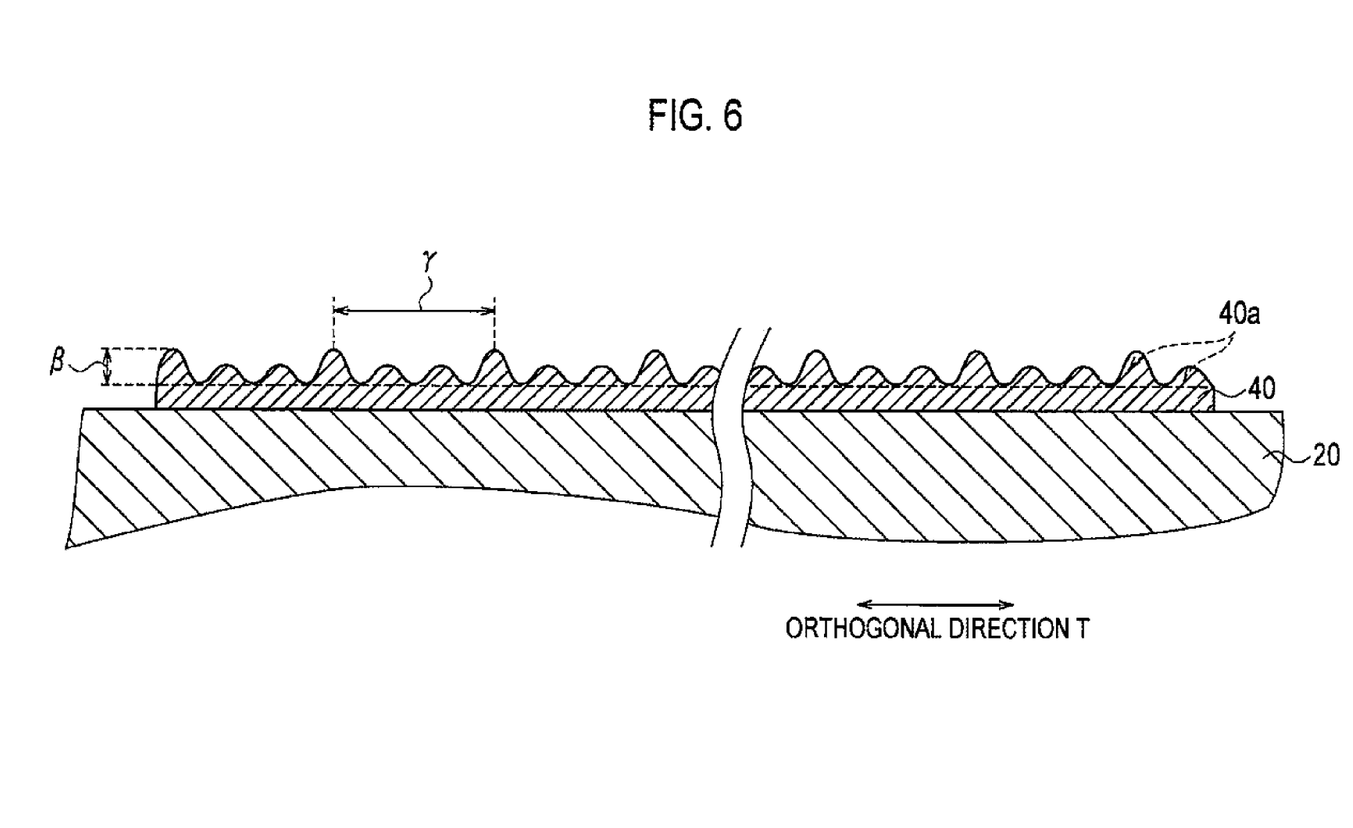
FIG. 6 is a cross-sectional view taken along the line B-B of FIG. 4.

Next, projections 40a included in each connection electrode 40 are described with reference to FIGS. 4 to 6. FIG. 4 is an enlarged view of a surface of each connection electrode 40 shown in FIG. 3. FIG. 5 is a cross-sectional view taken along the line A-A of FIG. 4. FIG. 6 is a cross-sectional view taken along the line B-B of FIG. 4.

As shown in FIG. 4, the plurality of projections 40a are formed on the surface, facing the wiring member 11, of the connection electrode 40. The plurality of projections 40a can be formed by a printing method such as screen printing, for example.

To be more specific, a board used for screen printing has a mesh obtained by stretching wires to have a lattice pattern. Emulsion is filled in a part of openings of the mesh and absent in the other part of the openings of the mesh in accordance with the shape of the connection electrode 40. A resin conductive paste is pushed out onto the photoelectric conversion body 20 through the other part of the mesh where emulsion is absent. Thus, the plurality of projections 40a are formed on the surface of the connection electrode 40 to correspond to the mesh.

Here, as shown in FIG. 4, the plurality of projections 40a are continued in a cross direction K crossing the arrangement direction H. This is for preventing a wire portion of the mesh from overlapping the positions of the fine-line electrodes 30 when the fine-line electrodes 30 and the connection electrodes 40 are subjected to screen printing at the same time. In FIG. 4, a bias angle of approximately 30 degrees is provided between the arrangement direction H and the cross direction K.

When a common board is used, as shown in FIG. 5, a height $\beta$ of each of the plurality of projections 40a is approximately 5 to 20 μm, and a pitch α indicating an interval between adjacent two vertices of the projections 40a is approximately 30 μm.

Moreover, as shown in FIG. 6, the plurality of projections 40a different in height are continued in the orthogonal direction T substantially orthogonal to the arrangement direction H. A pitch γ indicating an interval between adjacent two vertices of the projections 40a in the orthogonal direction T is approximately 100 μm.

(Connection Between Connection Electrode and Wiring Member)

Figure 7:
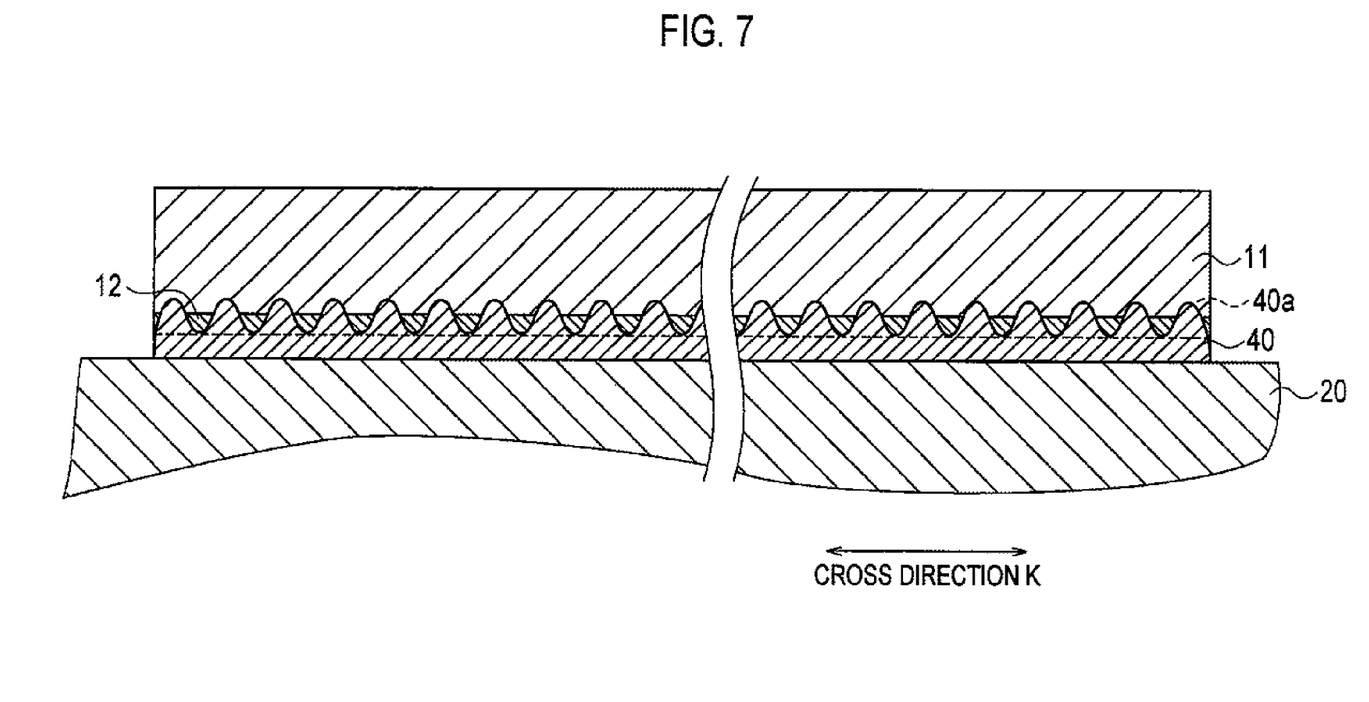
FIG. 7 is a cross-sectional view taken along the line X-X of FIG. 2.
Figure 8:
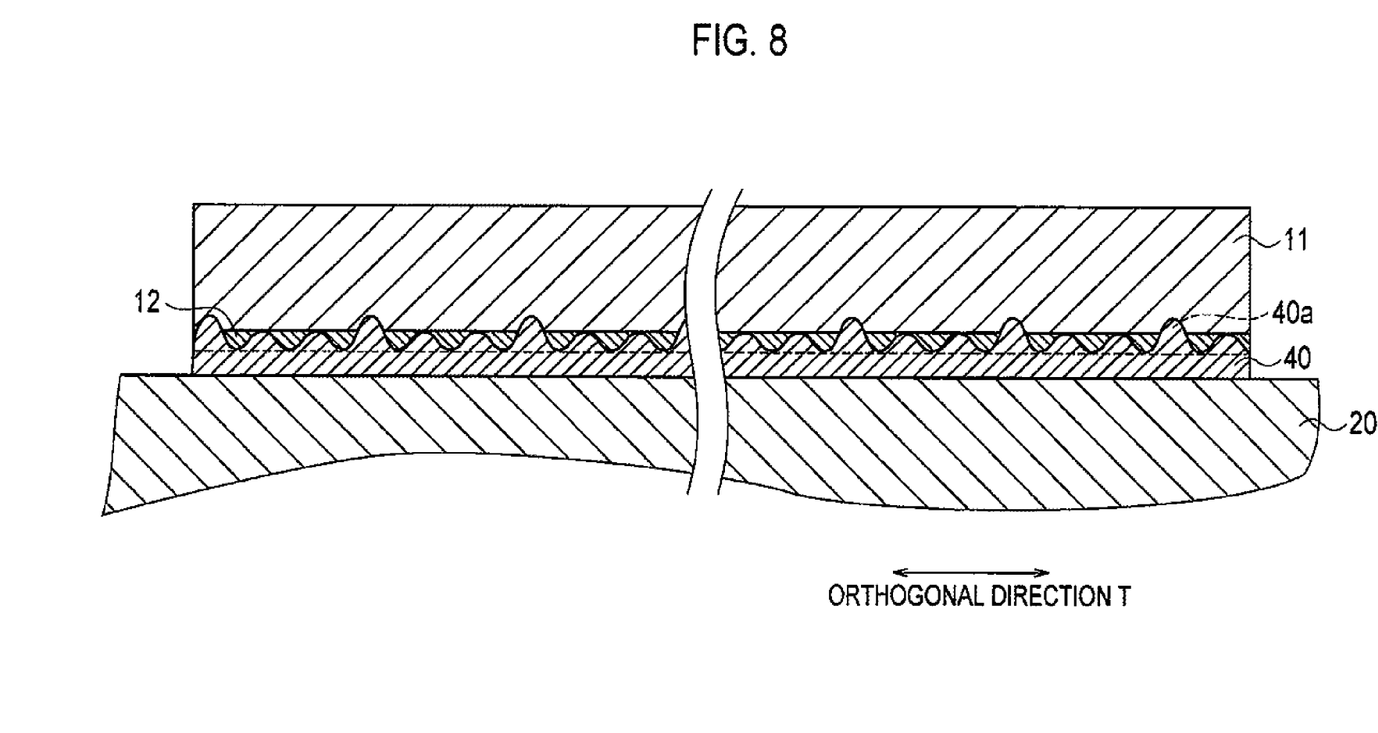
FIG. 8 is a cross-sectional view taken along the line Y-Y of FIG. 2.

Next, the connection between the connection electrode 40 and the wiring member 11 is described with reference to FIGS. 7 and 8. FIG. 7 is a cross-sectional view taken along the line X-X (in the cross direction K) of FIG. 2. FIG. 8 is a cross-sectional view taken along the line Y-Y (in the orthogonal direction T) of FIG. 2.

As shown in FIGS. 7 and 8, the plurality of projections 40a are in direct contact with the wiring member 11. To be more specific, the plurality of projections 40a bite into the above-described electrical conductor of the wiring member 11. This allows establishing a direct electrical and mechanical connection between the connection electrode 40 and the wiring member 11.

The resin adhesive 12 is sandwiched between the connection electrode 40 and the wiring member 11. The plurality of projections 40a penetrate the resin adhesive 12, and the resin adhesive 12 is thus arranged between the plurality of projections 40a. The wiring member 11 is bonded to the connection electrode 40 with the resin adhesive 12. Moreover, if the resin adhesive 12 includes the plurality of conductive particles, the connection electrode 40 and the wiring member 11 are electrically connected to each other also through the plurality of conductive particles.

Figure 9:
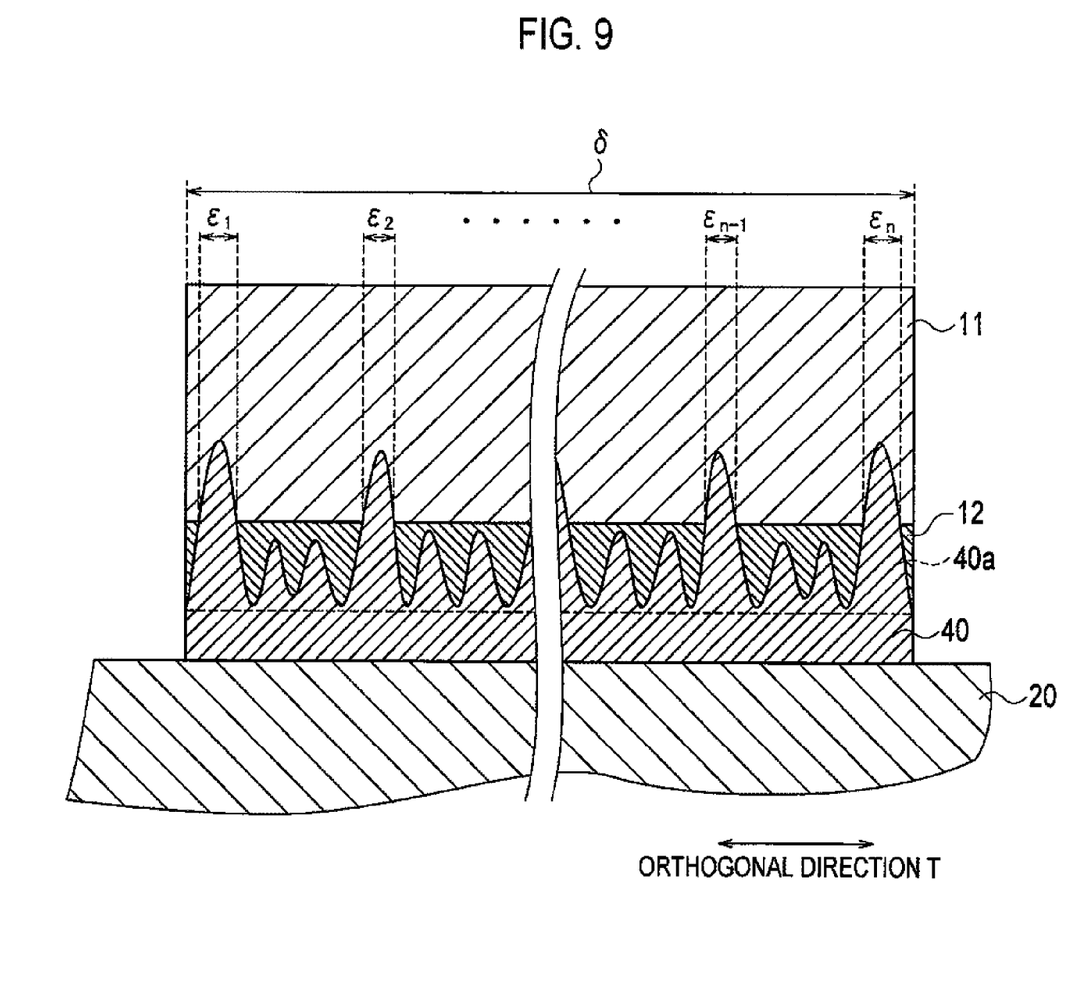
FIG. 9 is an enlarged view of FIG. 8.

FIG. 9 is an enlarged view of FIG. 8. As shown in FIG. 9, the width of the wiring member 11 in the orthogonal direction T is $\delta$. Here, n projections 40a bite into the wiring member 11, and bite widths $\epsilon$ of the n projections 40a in the orthogonal direction T are $\epsilon 1, \epsilon 2, \ldots, \epsilon n-1$, and $\epsilon n$, respectively.

Hence, in the orthogonal direction T, a ratio $\phi$ of the sum of the bite widths $\epsilon$ of the n projections 40a to the width $\delta$ of the wiring member 11 is $(\epsilon 1 + \epsilon 2 + \ldots + \epsilon n-1 + \epsilon n)/\delta$.

The ratio $\phi$ may be set appropriately in consideration of the amount of power generation in the photoelectric conversion body 20, the existence or absence of conductive particles, and the like. In order to establish a sufficient electrical and mechanical connection between the connection electrode 40 and the wiring member 11, the ratio $\phi$ is preferably equal to or higher than 0.05.

(Method of Manufacturing Solar Cell Module)

Next, an example of a method of manufacturing the solar cell module 100 according to this embodiment is described.

First, an i-type amorphous silicon layer and a p-type amorphous silicon layer are sequentially stacked on a light-receiving surface side of an n-type monocrystalline silicon substrate by using the CVD (Chemical Vapor Deposition) method. Likewise, an i-type amorphous silicon layer and an n-type amorphous silicon layer are sequentially stacked on a back surface side of the n-type monocrystalline silicon substrate. Here, the i-type amorphous silicon layers formed on the light-receiving surface side and back surface side of the n-type monocrystalline silicon substrate are each formed to have a thickness which does not substantially contribute to power generation, for example, several Å to 250 Å thick.

Subsequently, an ITO film is formed on a light-receiving surface side of the p-type amorphous silicon layer by using the PVD (Physical Vapor Deposition) method. Likewise, an ITO film is formed on a back surface side of the n-type amorphous silicon layer. With the above processes, the photoelectric conversion body 20 is fabricated.

Then, an epoxy thermosetting silver paste is arranged with a pattern shown in FIG. 3 on the light-receiving surface and back surface of the photoelectric conversion body 20 by using a printing method such as a screen printing method. In this event, a plurality of projections 40a are formed on a surface of the connection electrode 40 to correspond to openings of a mesh used in the screen printing.

Thereafter, the silver paste is heated under a predetermined condition and cured. Thereby, the solar cell 10 is fabricated.

Next, the wiring member 11 is thermally pressure-bonded onto the connection electrode 40 through the resin adhesive 12 including the plurality of conductive particles. To be more specific, the resin adhesive 12 and the wiring member 11 are sequentially arranged on the connection electrodes 40 formed on each of the light-receiving surface and back surface of the photoelectric conversion body 20. Then, the wiring member 11 is pressed toward the solar cell 10 by using a heater block. Thereby, all of or a part of the plurality of projections 40a formed on a surface, facing the wiring member 11, of each connection electrode 40 are brought into direct contact with the wiring member 11. In this event, all of or the part of the plurality of projections 40a can be caused to bite into the electrical conductor of the wiring member 11 by pressure and temperature adjustment. With the above processes, the solar cell string 1 is made.

Subsequently, a stacked body is made by sequentially stacking an EVA (sealant 4) sheet, the solar cell string 1, an EVA (sealant 4) sheet, and a PET sheet (back-surface-side protection member 3) on a glass substrate (light-receiving-surface-side protection member 2).

Then, EVA is cured by thermally pressure-bonding the stacked body. With the above processes, the solar cell module 100 is manufactured.

Note that a terminal box, an Al frame, and the like may be installed in the solar cell module 100.

(Effects and Advantages)

In the solar cell module 100 according to this embodiment, the wiring member 11 is connected onto the connection electrode 40 through the resin adhesive 12. Moreover, the connection electrode 40 has the plurality of projections 40a which are in direct contact with the wiring member 11.

Since the connection electrode 40 has the plurality of projections 40a which are in direct contact with the wiring member 11 in this way, it is possible to establish a favorable electrical connection between the connection electrode 40 and the wiring member 11. Thus, even when the wiring member 11 receives stress from the sealant 4 in accordance with temperature change under environment where the solar cell module 100 is used, it is possible to establish a favorable electrical connection between the connection electrode 40 and the wiring member 11.

Moreover, the plurality of projections 40a according to this embodiment are in direct contact with the wiring member 11 in such a way as to bite into the wiring member 11. Since the plurality of projections 40a bite into the wiring member 11 in this way, a contact area between the connection electrode 40 and the wiring member 11 is increased. This makes an electrical connection between the connection electrode 40 and the wiring member 11 more favorable, and increases their mechanical connection strength.

For example, the position of the wiring member 11 is sometimes microscopically displaced from the connection electrode 40 due to stress received from the sealant 4. Even in such a case, a favorable electrical connection can be maintained since the plurality of projections 40a are in direct contact with the wiring member 11. Further, in the case where the plurality of projections 40a bite into the wiring member 11, the plurality of projections 40a caught in the wiring member 11 allow the wiring member 11 to go back to the original position. This consequently makes it possible to maintain a favorable electrical connection between the wiring member 11 and the connection electrode 40.

Further, in the solar cell module 100 according to this embodiment, the resin adhesive 12 includes the plurality of conductive particles. This allows establishing a more favorable electrical connection between the connection electrode 40 and the wiring member 11. Furthermore, since the plurality of projections 40a bite into the wiring member 11 as described above, the connection electrode 40 and the wiring member 11 are mechanically robustly connected to each other. This allows suppressing the displacement of the conductive particles due to the deformation of the resin adhesive 12.

(Other Embodiments)

The present invention has been described by way of the above embodiment. However, it should not be understood that the description and drawings constituting a part of the disclosure limit the present invention. Various alternative embodiments, examples, and operational techniques will be apparent for those skilled in the art from the disclosure.

For example, in the above embodiment, the plurality of projections 40a are formed by using the screen printing method. Alternatively, the plurality of projections 40a may be formed by subjecting the connection electrode 40 to a mechanical process, or by repeatedly applying the conductive paste on the surface of the connection electrode 40.

Further, in the above embodiment, the plurality of projections 40a bite into the wiring member 11. However, the plurality of projections 40a have only to be in direct contact with the surface of the wiring member 11.

Further, although not specifically mentioned in the above embodiment, not all the projections 40a formed on the surface of the connection electrode 40 have to be in direct contact with the wiring member 11. In other words, the connection electrode 40 may have the projections 40a which are in direct contact with the wiring member 11 and projections which are not in direct contact with the wiring member 11.

Further, although not specifically mentioned in the above embodiment, the plurality of projections 40a may include a plurality of first projections of large height and a plurality of second projections of small height. Furthermore, the plurality of first projections among the plurality of projections 40a may be in direct contact with the wiring member. In this case, the plurality of second projections may be away from the wiring member.

Further, in the above embodiment, the bias angle of approximately 30° is provided between the arrangement direction H and the cross direction K. However, the bias angle is not limited to this angle. Furthermore, the plurality of projections 40a may be continued in the arrangement direction H.

Further, in the above embodiment, the plurality of projections 40a are formed to be regularly arranged in lines on the surface of the connection electrode 40. However, heights of and pitches between adjacent two vertices of the plurality of projections 40a do not necessarily have to be regular.

Further, in the above embodiment, the connection electrode 40 is continuously formed in the arrangement direction H. Alternatively, the connection electrode 40 may be divided into plural sections in the arrangement direction H. The present invention does not limit the shape of the connection electrode 40.

Further, in the above embodiment, the fine-line electrodes 30 and the connection electrodes 40 are formed on the back surface of the photoelectric conversion body 20. Alternatively, the electrodes may be formed to cover the entire back surface. The present invention does not limit the shape of the electrodes formed on the back surface of the photoelectric conversion body 20.

Further, in the above embodiment, the fine-line electrode 30 is formed in the orthogonal direction to have a line shape. However, the shape of the fine-line electrode 30 is not limited to this. For example, a plurality of fine-line electrodes 30 in the form of wavy lines may cross in the form of lattice.

As described, it goes without saying that the present invention includes various embodiments and the like not listed herein. Accordingly, the technical scope of the present invention is to be defined only by the specific subject matters of the invention according to the scope of the invention defined appropriately from the above description.

EXAMPLES

Hereinafter, examples of the solar cell module according to the present invention are specifically described. The present invention is not limited to the following examples, and may be appropriately modified and implemented without changing the gist of the present invention.

Example 1

First, a photoelectric conversion body was fabricated by using an n-type monocrystalline silicon substrate with a dimension of 100 mm square.

On the light-receiving surface and back surface of the photoelectric conversion body, fine-line electrodes and connection electrodes were formed to have a lattice pattern (see FIG. 3) with an epoxy thermosetting silver paste by using a screen printing method. Each connection electrode was of 50 μm height and 1.5 mm width.

Subsequently, an epoxy resin adhesive was applied to the connection electrodes formed on the light-receiving surface of one solar cell and the connection electrodes formed on the back surface of a different solar cell adjacent to the one solar cell. An adhesive obtained by kneading 10000 nickel particles in 1 mm3 of epoxy resin was used as the epoxy resin adhesive. The use of the adhesive described above allows fabricating a resin adhesive in which nickel particles exist while being dispersed from each other. Here, an epoxy resin adhesive shaped into a film may be disposed on the connection electrode instead of applying the epoxy resin adhesive.

Next, a wiring material was prepared by covering with SnAgCu solder a surface of flat copper foil of 1.5 mm width. Subsequently, a wiring member was disposed on the epoxy resin adhesive. Then, pressure was applied at 0.25 MPa for 60 seconds from above and below the wiring member by using a metal head heated to 200° C.

With the above processes, a solar cell string according to this example was fabricated. The solar cell string described above was sealed with EVA between glass and a PET film to fabricate a solar cell module according to Example 1.

Example 2

A solar cell module according to Example 2 was fabricated with pressure to apply on the wiring member by use of the metal head set to 0.5 MPa. Other processes were the same as those of Example 1.

Example 3

A solar cell module according to Example 3 was fabricated with pressure to apply on the wiring member by use of the metal head set to 0.75 MPa. Other processes were the same as those of Example 1.

Example 4

A solar cell module according to Example 4 was fabricated with pressure to apply on the wiring member by use of the metal head set to 1.0 MPa. Other processes were the same as those of Example 1.

Example 5

A solar cell module according to Example 5 was fabricated with pressure to apply on the wiring member by use of the metal head set to 2.0 MPa. Other processes were the same as those of Example 1.

Comparative Example

A solar cell module according to Comparative Example was fabricated with pressure to apply on the wiring member by use of the metal head set to 0.02 MPa. Other processes were the same as those of Example 1.

(Observation of Biting of Projections)

An observation was made as to how the projections of the connection electrode of the solar cell module according to each of Examples 1 to 5 and Comparative Example described above bite into the wiring member.

Specifically, a cross section near the central line of the connection electrode and the wiring member was observed with a scanning electron microscope (SEM) to measure an average bite depth of the plurality of projections and a ratio φ of the sum of bite widths of the plurality of projections to the width of the wiring member (1.5 mm) in the orthogonal direction T (($\epsilon 1 + \epsilon 2 + \ldots + \epsilon n-1 + \epsilon n)/\delta$). Table 1 shows a measurement result of the average bite depth and the ratio φ.

TABLE 1

|  | pressing force (MPa) | bite depth (μm) | ratio φ |
| --- | --- | --- | --- |
| Example 1 | 0.25 | 0.1 | 0.05 |
| Example 2 | 0.50 | 0.5 | 0.32 |
| Example 3 | 0.75 | 1.2 | 0.44 |
| Example 4 | 1.00 | 2.0 | 0.54 |
| Example 5 | 2.00 | 3.0 | 0.58 |
| Comparative Example | 0.02 | 0.0 | 0.00 |

As shown in the above table, it was confirmed in Examples 1 to 5 that the bite depth and the ratio φ became larger as the pressing force was sequentially increased. On the other hand, in Comparative Example, projections did not bite into the wiring member due to the small pressing force.

(Temperature Cycle Test)

Next, the solar cell modules according to Examples 1 to 5 and Comparative Example were subjected to a temperature cycle test by use of a constant temperature oven.

Here, the temperature cycle test was conducted in accordance with the regulations of JIS C 8917. Specifically, the samples held in the constant temperature oven were increased in temperature from 25° C. up to 90° C. in 45 minutes, then kept at this temperature for 90 minutes, then decreased in temperature down to −40° C. in 90 minutes, then kept at this temperature for 90 minutes, and then increased in temperature up to 25° C. in 45 minutes. The above steps were taken as one cycle (6 hours) and 550 cycles were carried out.

Table 2 shows a result of measuring the energy output of each solar cell module before and after the test. Table 2 shows values obtained by taking the output value of Example 5 before the test as 100. Note that, the energy output of each solar cell module was measured under AM 1.5, 100 mW/cm2 illumination.

TABLE 2

| number of cycles | energy output | | | |
|---|---|---|---|---|
| | 0 | 180 | 360 | 550 |
| Example 1 | 100.00 | 100.67 | 99.16 | 99.89 |
| Example 2 | 100.67 | 100.69 | 99.02 | 100.65 |
| Example 3 | 100.69 | 99.99 | 98.24 | 99.51 |
| Example 4 | 99.99 | 100.28 | 98.72 | 99.88 |
| Example 5 | 100.00 | 100.00 | 96.06 | 99.73 |
| Comparative Example | 67.00 | 67.00 | 59.00 | 42.00 |

As shown in the above tables, each of Examples 1 to 5 could maintain the energy output even after the temperature cycle test. This is because the projections of the connection electrode were in direct contact with the wiring member as shown in Table 1, and thus a favorable electrical connection between the connection electrode and the wiring member was maintained. Accordingly, it was confirmed that the direct contact of the projections with the wiring member allows maintaining a favorable electrical connection between the connection electrode and the wiring member. Further, as shown in Table 1, the ratio φ of Example 1 with the smallest pressing force was 0.05. Thus, it was found that the ratio φ of 0.05 or higher is preferable.

On the other hand, in Comparative Example, since the projections of the connection electrode were not in direct contact with the wiring member, an electrical connection between the connection electrode and the wiring member could not be maintained.

INDUSTRIAL APPLICABILITY

As has been described, the present invention can provide a solar cell module capable of maintaining a favorable electrical connection between a wiring member and a connection electrode, and is thus advantageous in the field of solar power generation.

The invention claimed is:

1. A solar cell module comprising:
a plurality of solar cells;
a wiring member configured to electrically connect the plurality of solar cells to each other; and
a sealant with which the plurality of solar cells are sealed, wherein
one solar cell included in the plurality of solar cells includes
a photoelectric conversion body configured to generate a light generation carrier by receiving light, and
a connection electrode formed on the photoelectric conversion body and connected to the wiring member;
the wiring member is connected onto the connection electrode through a resin adhesive; and
the connection electrode includes:
a bus bar electrode provided along the wiring member;
a plurality of finger electrodes provided along a direction intersecting with the bus bar electrode; and
a plurality of projections, which are formed on a surface of the bus bar electrode,
wherein the plurality of projections include a plurality of first projections and a plurality of second projections taller than the plurality of first projections; and
wherein the plurality of second projections bite into the wiring member and the plurality of first projections are spaced away from the wiring member.

2. The solar cell module according to claim 1, wherein
the wiring member includes a low resistive element and an electrical conductor which covers an outer periphery of the low resistive element wherein the electrical conductor accepts the projections that bite thereinto, and
the plurality of second projections bite into the electrical conductor.

3. The solar cell module according to claim 1, wherein, in a direction substantially orthogonal to an arrangement direction in which the plurality of solar cells are arranged, a ratio of a sum of widths of the respective plurality of second projections at portions biting into the wiring member with respect to a width of the wiring member is not lower than 0.05.

4. The solar cell module according to claim 1, wherein
parts of the respective plurality of second projections are in direct contact with the wiring member.

5. The solar cell module according to claim 4, wherein the plurality of first projections are arranged in a direction crossing the arrangement direction in which the plurality of solar cells are arranged.

6. The solar cell module according to claim 1, wherein the resin adhesive includes a plurality of conductive particles.

7. The solar cell module according to claim 6, wherein the plurality of conductive particles are dispersed in the resin adhesive.

8. The solar cell module according to claim 1, wherein at least some of the plurality of second projections of the connection electrode bite into wiring member by at least 0.1 micron.

9. The solar cell module according to claim 8, wherein at least some of the plurality of second projections of the connection electrode bite into wiring member by at least 0.1 micron to 3 microns.

10. The solar cell module according to claim 1, wherein a height of each of the plurality of second projections is in a range of from 5 to 20 microns, and wherein a height of each of the plurality of first projections is in a range of from 5 to 20 microns, and wherein the heights of the first projections is lower than the heights of the second projections.

11. The solar cell module according to claim 10, wherein the height of the connection electrode is 50 microns.

12. The solar cell module according to claim 8, wherein a ratio of a sum of widths of the respective plurality of second projections at portions biting into the wiring member with respect to a width of the wiring member is not lower than 0.05.

13. The solar cell module of claim 2, wherein the electrical conductor has a lower hardness than the low resistive element.

14. The solar cell module of claim 2, wherein the electrical conductor is made of lead free solder.

15. The solar cell module of claim 2, wherein the electrical conductor is at least 3 microns thick.

16. The solar cell module of claim 1, wherein the plurality of second projections are spaced apart from each other such that at least two of the plurality of first projections are provided between an adjacent two of the plurality of second projections.

* * * * *